(12) United States Patent
Takai et al.

(10) Patent No.: US 6,531,928 B2
(45) Date of Patent: Mar. 11, 2003

(54) HIGH-FREQUENCY MODULE

(75) Inventors: Kiyofumi Takai, Omihachiman (JP); Fumitoshi Sato, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/972,213

(22) Filed: Oct. 9, 2001

(65) Prior Publication Data

US 2002/0075084 A1 Jun. 20, 2002

(51) Int. Cl.$^7$ .............................. H03B 5/12; H03B 5/18
(52) U.S. Cl. ............... 331/108 D; 331/96; 331/117 R; 331/117 FE; 331/117 D; 331/175; 331/177 V
(58) Field of Search ............................... 331/68, 74–76, 331/107 SL, 108 R, 108 D, 114, 117 R, 117 FE, 117 D, 175, 177 V

(56) References Cited

U.S. PATENT DOCUMENTS 4,758,922 A * 7/1988 Ishigaki et al. ............. 361/330
5,227,739 A * 7/1993 Mandai et al. .............. 331/96

* cited by examiner

Primary Examiner—David C. Mis
(74) Attorney, Agent, or Firm—Keating & Bennett, LLP

(57) ABSTRACT

A voltage-controlled oscillator includes a multilayer substrate having two grounding electrodes. A bare chip IC, a grounding capacitance connected to the collector of a transistor in an oscillator stage disposed in the IC, an electronic component, and other elements, are mounted on one surface of the multilayer substrate, and the electronic components are connected by an electrode pattern. A microstrip line electrode is disposed between the grounding electrodes inside the multilayer substrate, and the collector of the transistor and the capacitor disposed in the IC are connected by through-holes. A sealing resin is filled between the IC and the multilayer substrate to maintain the mounting strength of the IC. A space is provided between the IC and the capacitor to prevent adhesion of the sealing resin to the grounding capacitance.

21 Claims, 3 Drawing Sheets

HIGH-FREQUENCY MODULE

BACKGROUND OF THE INVENTION

1. Field of the Invention

The present invention relates to a high-frequency module and more particularly to a high-frequency module such as a voltage-controlled oscillator including bare chip active elements or bare chip ICs including active elements mounted on a multilayer substrate.

2. Description of the Related Art

FIG. 4 is a schematic illustration showing the essential portion of a conventional voltage-controlled oscillator. The voltage-controlled oscillator 1 contains a multilayer substrate 2. A bare chip IC 3, a capacitor 4, another electronic component 5, and other elements, are mounted on the multilayer substrate 2. A transistor in the oscillator stage defines an active element in the IC 3. Moreover, a bare chip transistor itself in the oscillator stage may be mounted instead of the IC 3. Furthermore, the voltage-controlled oscillator 1 is arranged such that an electrode pattern 6 is disposed on the multilayer substrate 2 and the electronic components mounted on the multilayer substrate 2 are connected.

The voltage-controlled oscillator 1 is constructed so as to have a circuit as shown in FIG. 5, for example. The voltage-controlled oscillator 1 contains a capacitor C1 connected between the power-supply voltage Vc and the ground. Moreover, one end of a strip line SL1 is connected to the power-supply voltage Vc, and the other end of the strip line SL1 is connected to the cathode of a variable capacitance diode D1 and one end of a capacitor C2. The anode of the variable capacitance diode D1 is connected to the ground. Furthermore, the other end of the capacitor C2 is connected to one end of each of a strip line SL2, a capacitor C3, and another capacitor C4. The other ends of the strip line SL2 and the capacitor C3 are connected to the ground. Furthermore, the capacitor C4 is connected to a voltage divider circuit including resistors R1, R2, and R3.

This voltage divider circuit is connected between the power-supply voltage Vb and the ground. Moreover, the power-supply voltage Vb is connected to the collector of the npn transistor Tr1 through a strip line SL3. The emitter of this transistor Tr1 is connected to the collector of another npn transistor Tr2, and the emitter of the transistor Tr2 is connected to one end of a resistor R4. The other end of the transistor R4 is connected to the ground through a parallel circuit of a strip line SL4 and a capacitor C5.

The connection point of the resistors R1 and R2 is connected to the base of the transistor Tr1. Furthermore, the connection point of the resistors R2 and R3 and the capacitor C4 are connected to the base of the transistor Tr2. Moreover, one end of a capacitor C6 is connected to the base of the transistor Tr1, and the other end of the capacitor C6 and the base of the transistor Tr2 are connected to the emitter of the transistor Tr2 through a capacitor C7. Moreover, the emitter of the transistor Tr2 is connected to the ground through a capacitor C8.

Furthermore, the connection point of the power-supply voltage Vb and the strip line SL3 is grounded through a capacitor C9. Moreover, the connection point of the strip line SL3 and the transistor Tr1 is connected to an output terminal through a capacitor C10 and simultaneously grounded through a capacitor C11. Furthermore, the connection point of the emitter of the transistor Tr1 and the collector of the transistor Tr2 is grounded through a capacitor C12.

In the voltage-controlled oscillator 1 shown in FIG. 4, the capacitor 4 that is disposed on the multilayer substrate 2 is the capacitor C12 connected to the collector of the transistor Tr2 in the oscillator stage, and one end of the capacitor 4 is connected to the collector of the transistor Tr2 provided in the IC3 and the other end is grounded. In this voltage-controlled oscillator 1, the electronic components are, for example, flip-chip mounted, and the IC3 is connected to an electrode pattern 6 through bumps 7. As a matter of course, these electronic components may be connected to the electrode pattern 6 by wire bonding. Then, a sealing resin 8 is filled between the IC3 and the multilayer substrate 2 to secure a sufficient mounting strength.

However, in such a voltage-controlled oscillator, when the sealing resin filled between the IC and the multilayer substrate is in contact with other electronic components, particularly a capacitor connected to the collector of a transistor in the oscillator stage, since the high-frequency impedance of the electronic component changes, fluctuations of the oscillator output level and the high-frequency level and deterioration of the C/N ratio, etc., are caused, and accordingly stable characteristics cannot be obtained. Furthermore, since thermal expansion coefficients of the sealing resin and the multilayer substrate are different, there is a problem in that the reliability in a thermal shock test and the reliability of the mounted electronic parts are degraded.

SUMMARY OF THE INVENTION

In order to overcome the problems described above, preferred embodiments of the present invention provide a high-frequency module in which the influence of a sealing resin used to secure the mounting strength of active elements on a multilayer substrate is minimized and stable characteristics and a high reliability are achieved.

According to a preferred embodiment of the present invention, a high-frequency module includes a multilayer substrate, a bare-chip active element mounted on the multilayer substrate, a resin for sealing the active element on the multilayer substrate, and a grounding capacitance connected to the active element. In the high-frequency module, a strip line provided inside the multilayer substrate constitutes the grounding capacitance.

Furthermore, according to another preferred embodiment of the present invention, a high-frequency module includes a multilayer substrate, a bare-chip active element mounted on the multilayer substrate, a resin for sealing the active element on the multilayer substrate, and a grounding capacitance connected to the active element. In the high-frequency module, the grounding capacitance is preferably constructed by a strip line provided inside the multilayer substrate and a capacitor provided on the multilayer substrate.

Furthermore, according to another preferred embodiment of the present invention, a high-frequency module includes a multilayer substrate, a bare-chip active element mounted on the multilayer substrate, a resin for sealing the active element on the multilayer substrate, and a grounding capacitance connected to the active element. In the high-frequency module, the grounding capacitance is preferably constructed by a strip line provided inside the multilayer substrate and a microstrip line provided on the multilayer substrate.

In these high-frequency modules, the active element is preferably a transistor or an FET (field-effect transistor) in an oscillator stage and a voltage-controlled oscillator including the active element, and the collector of the transistor or the drain of the FET is connected to the grounding capacitance to construct the voltage-controlled oscillator.

When a grounding capacitance to be connected to an active element is constructed to include a strip line disposed in the multilayer substrate, the number of electronic components to be mounted on the multilayer substrate is significantly decreased and the possibility that the sealing resin for increasing the mounting strength of the active element may contact the other electronic components such as the grounding capacitance, or others, can be eliminated. Here, when the active element is connected to the other electronic components by an electrode disposed on the multilayer substrate, the influence of a stray capacitance generated between the active element and the electrode is increased by the sealing resin attached to the electrode for connection, but when the strip line is disposed inside the multilayer substrate, generation of stray capacitance between the active element and the strip line is prevented, and accordingly fluctuations in characteristics of the high-frequency module are minimized ed.

Furthermore, also when a grounding capacitance connected to an active element is constructed to include a strip line disposed inside the multilayer substrate and a capacitor mounted on the multilayer substrate or constructed by a strip line disposed inside the multilayer substrate and a microstrip line disposed on the multilayer substrate, the active element and the grounding capacitance can be connected by the strip line, and accordingly stray capacitance caused by the sealing resin is minimized.

Moreover, when a voltage-controlled oscillator is constructed as a high-frequency module, it is possible to construct the voltage-controlled oscillator such that the sealing resin does not contact a grounding capacitance connected to the collector of a transistor or the drain of an FET in the oscillator stage, and, as a result, the voltage-controlled oscillator having minimal fluctuations in the characteristics can be obtained.

The above-described and other features, elements characteristics, and advantages of the present invention will be made clear from the following detailed description of preferred embodiments of the present invention with reference to the accompanying drawings.

DETAILED DESCRIPTION OF PREFERRED EMBODIMENTS

Figure 1:
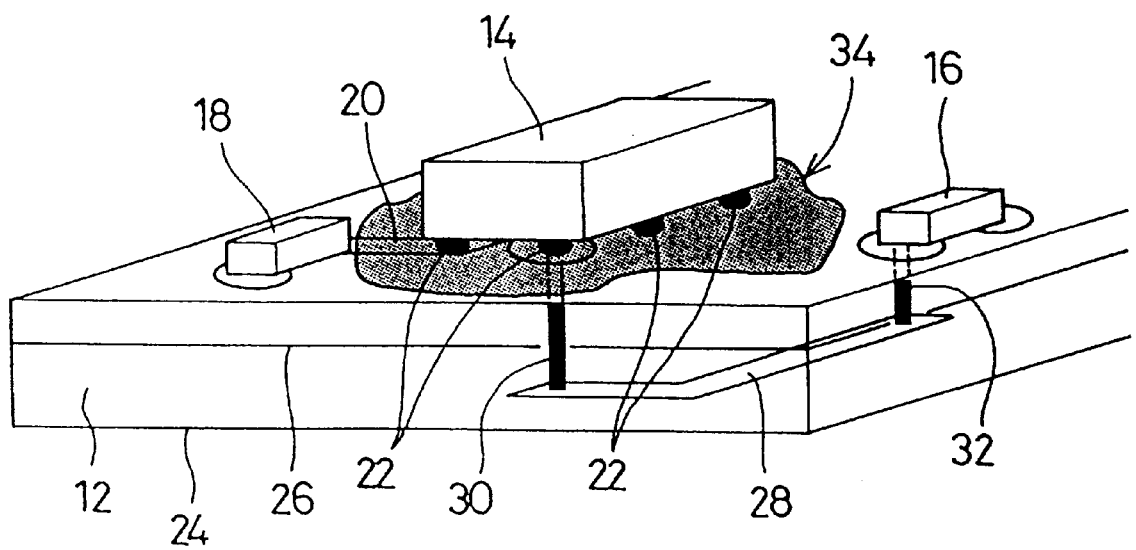
FIG. 1 is a schematic illustration showing an essential portion of a voltage-controlled oscillator as an example of a high-frequency module according to a preferred embodiment of the present invention.

FIG. 1 is a schematic illustration showing an essential portion of a voltage-controlled oscillator as an example of a high-frequency module according to a preferred embodiment of the present invention. The voltage-controlled oscillator 10 preferably includes a multilayer substrate 12 made of a dielectric material. A bare chip IC 14, a capacitor connected to the bare chip IC 14, another electronic component 18, and other electronic elements, are mounted on one surface of the multilayer substrate 12. A transistor or an FET in an oscillator stage of the voltage-controlled oscillator 10 is disposed in the bare chip IC 14. Then, the collector of the transistor or the drain of the FET in the oscillator stage is connected to the capacitor 16. Moreover, the transistor or the FET itself in the oscillator stage may be mounted instead of the IC 14. Furthermore, an electrode pattern 20 is disposed on the one surface of the multilayer substrate 12 and the electronic components on the multilayer substrate 12 are connected by the electrode pattern 20. The bare chip IC 14 is attached on the multilayer substrate 12 by bumps 22 through the use of flip-chip mounting.

A first grounding electrode 24 is disposed on the other surface of the multilayer substrate 12. Furthermore, a second grounding electrode 26 that is substantially parallel to the first grounding electrode 24 is disposed inside the multilayer substrate 12. A strip line electrode 28 is disposed between these grounding electrodes 24 and 26. One end of this strip line electrode 28 is connected to the collector of the transistor in the oscillator stage provided in the IC 14 via a through-hole 30 disposed in the multilayer substrate 12. Furthermore, the other end of the strip line electrode 28 is connected to one end of the capacitor 16 via a through-hole 32. Moreover, the other end of the capacitor 16 is grounded, although not illustrated.

Figure 5:
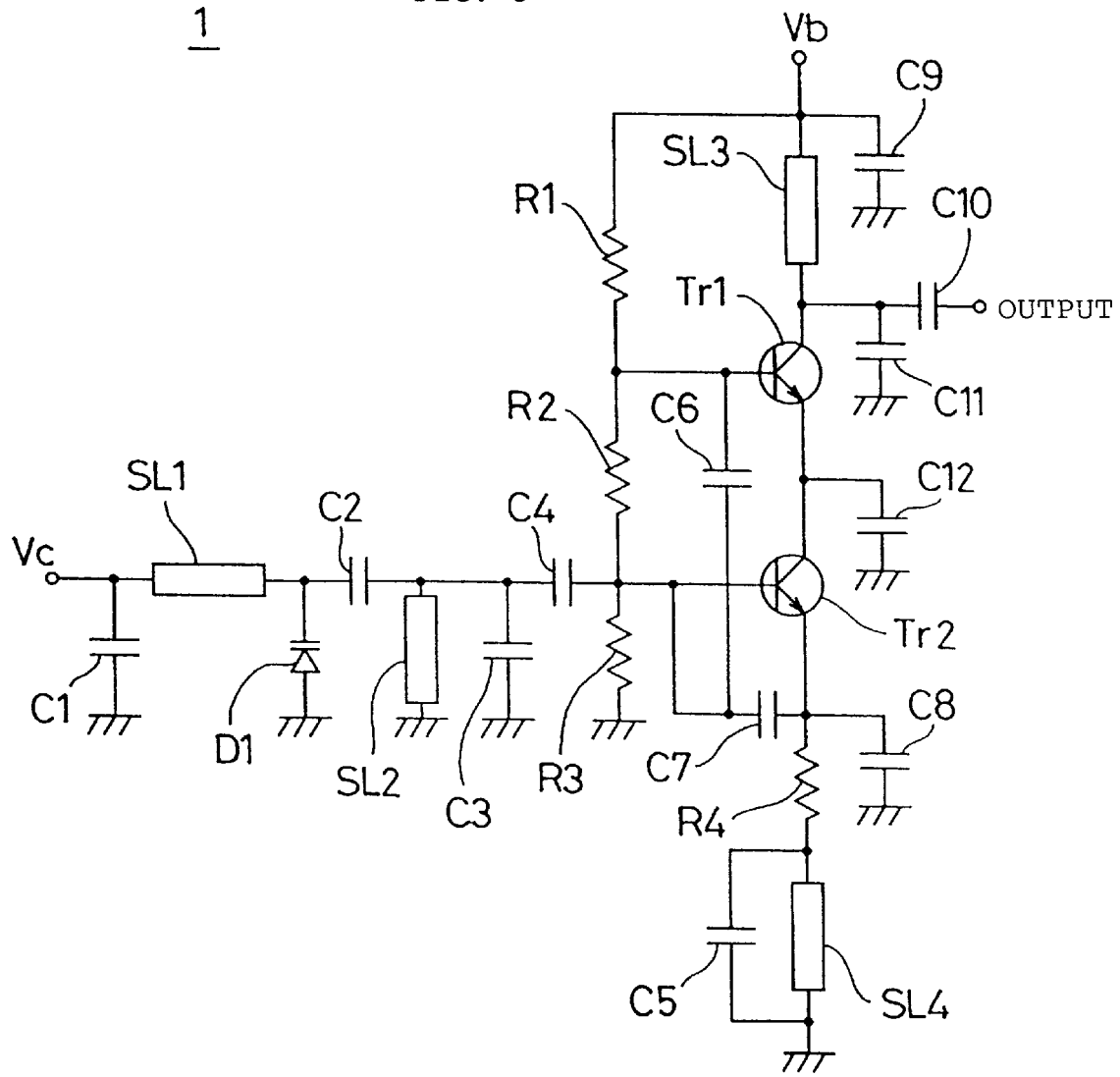
FIG. 5 is a circuit diagram of the voltage-controlled oscillator in FIG. 1.

This voltage-controlled oscillator 10 has a circuit configuration shown in FIG. 5, and the capacitor 16 corresponds to a grounding capacitance C12 connected to the collector of a transistor Tr 2 in the oscillator stage. In such a voltage-controlled oscillator 10, a sealing resin 34 is filled between the IC 14 and the multilayer substrate 12 in order to maintain the mounting strength of the IC 14. At this time, the IC 14 is spaced from the capacitor 16 to avoid adhesion of the sealing resin 34 to the capacitor 16. In this way, no electrode pattern for connecting the IC 14 and the capacitor 16 is provided on the one surface of the multilayer substrate 12, and no sealing resin is in contact with the capacitor 16. Accordingly, the capacitor 16 is not affected by the sealing resin, and fluctuations of the oscillator output level and the high-frequency level, deterioration of the C/N ratio, degradation of the reliability in a thermal shock test, and other defects, are reliably prevented, and thus stable characteristics are obtained.

Here, when the IC 14 and the capacitor 16 are connected by the electrode pattern disposed on the one surface of the multilayer substrate 12, since stray capacitance produced between the IC 14 and the electrode pattern increases, the dispersion in characteristics of the oscillator is caused. However, such stray capacitance is prevented by using the strip line disposed in the multilayer substrate 12, and thus stable characteristics are reliably achieved. Moreover, when the space between the IC 14 and the capacitor 16 is made larger, the strip line electrode 28 is lengthened to cause an impedance, but the influence of the impedance can be regulated by using other circuit elements.

Figure 2:
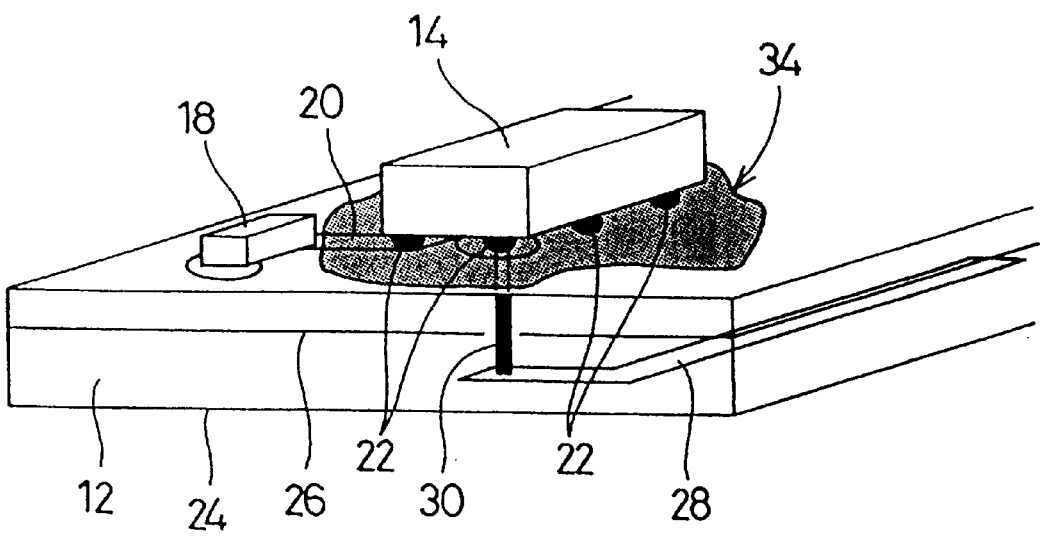
FIG. 2 is a schematic illustration showing an essential portion of another voltage-controlled oscillator as an example of a high-frequency module according to a preferred embodiment of the present invention.

Furthermore, as shown in FIG. 2, the grounding capacitance C12 to be connected to the collector of the transistor Tr 2 may include a strip line. In this case, nothing is connected to the other end of the strip line electrode 28, which is arranged as an open stub. In this way, when the open stub is defined by a strip line, the grounding capacitance C12 can be provided regardless of the portion where the sealing resin 34 is coated. Moreover, as shown in FIG.

3, the grounding capacitance C12 may include a strip line and a microstrip line. In this case, a microstrip line electrode 36 is disposed on the one surface of the multilayer substrate 12 and one end of the microstrip line electrode 36 is connected to the strip line electrode 28 via a through-hole 38. At this time, nothing is connected to the other end of the microstrip line electrode 36 that is arranged as an open stub.

Figure 3:
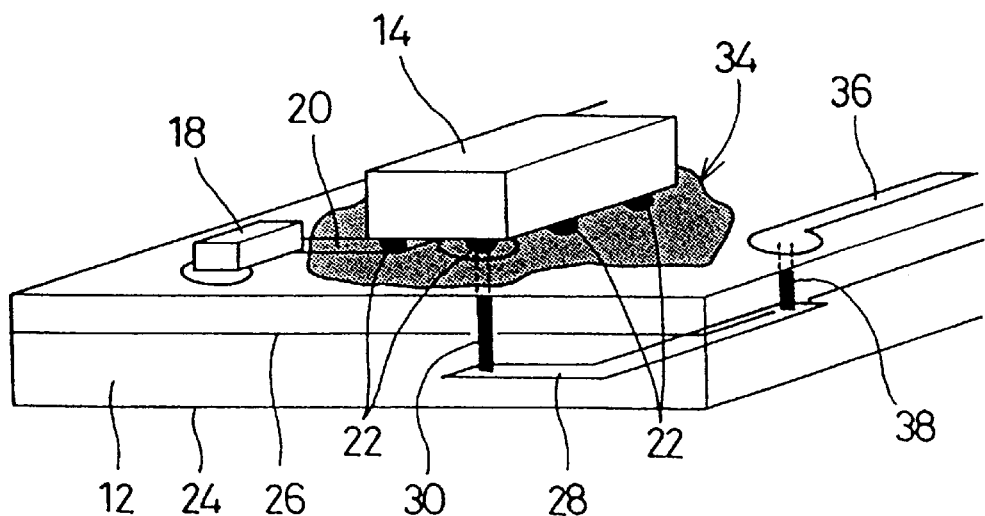
FIG. 3 is a schematic illustration showing an essential portion of another voltage-controlled oscillator as an example of a high-frequency module according to another preferred embodiment of the present invention.
Figure 4:
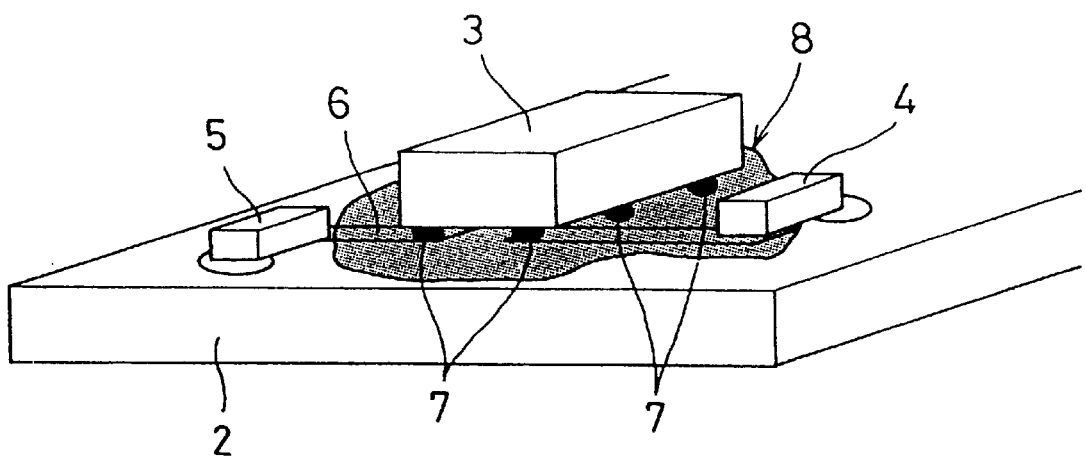
FIG. 4 is a schematic illustration showing an essential part of a conventional voltage-controlled oscillator.

In this way, also when the grounding capacitance C12 includes the strip line and the microstrip line, because the grounding capacitance C12 does not contact with the sealing resin 34, the influence of the sealing resin 34 can be prevented. Moreover, in the voltage-controlled oscillator 10 shown in FIGS. 2 and 3, the number of elements to be mounted on the multilayer substrate 12 can be decreased and accordingly the cost can be reduced.

According to various preferred embodiments of the present invention, because the collector of the transistor or the drain of the FET in the oscillator stage is not in contact with the sealing resin, fluctuations of the high-frequency impedance of the grounding capacitance to be caused by the sealing resin can be prevented. Because of that, fluctuations of the oscillator output level and the high-frequency level are less and a voltage-controlled oscillator having stable characteristics are achieved. Furthermore, the influence of the difference between thermal expansion coefficients of the sealing resin and the multilayer substrate on the electronic components can be minimized, and accordingly a highly reliable voltage-controlled oscillator can be obtained.

While preferred embodiments of the present invention have been described above, variations thereto will occur to those skilled in the art within the scope of the present invevtive concepts, which are delineated by the following claims.

What is claimed is:

1. A high-frequency module comprising:
   a multilayer substrate;
   a bare-chip active element mounted on the multilayer substrate;
   a resin arranged to seal the active element on the multilayer substrate; and
   a grounding capacitance connected to the active element, wherein a strip line provided inside the multilayer substrate constitutes the grounding capacitance.

2. A high-frequency module according to claim 1, wherein the bare-chip active element includes at least one of a transistor and a field-effect transistor provided in an oscillator stage and a voltage-controlled oscillator is defined by the active element, and wherein the collector of the transistor or the drain of the field-effect transistor is connected to the grounding capacitance to define the voltage-controlled oscillator.

3. A high-frequency module according to claim 1, wherein the high-frequency module includes a voltage controlled oscillator.

4. A high-frequency module according to claim 1, wherein the bare chip active element is a bare chip IC.

5. A high-frequency module according to claim 1, further comprising a capacitor connected to the bare chip active element.

6. A high-frequency module according to claim 1, further comprising a plurality of electronic components mounted on the multilayer substrate.

7. A high-frequency module according to claim 1, further comprising a plurality of bumps arranged to fix the bare chip active element on the multilayer substrate.

8. A high-frequency module comprising:
   a multilayer substrate;
   a bare-chip active element mounted on the multilayer substrate;
   a resin arranged to seal the active element on the multilayer substrate; and
   a grounding capacitance connected to the active element, wherein the grounding capacitance includes a strip line provided inside the multilayer substrate and a capacitor provided on the multilayer substrate.

9. A high-frequency module according to claim 8, wherein the active element includes at least one of a transistor and a field-effect transistor provided in an oscillator stage and a voltage-controlled oscillator is defined by the active element, and wherein the collector of the transistor or the drain of the field-effect transistor is connected to the grounding capacitance to define the voltage-controlled oscillator.

10. A high-frequency module according to claim 8, wherein the high-frequency module includes a voltage controlled oscillator.

11. A high-frequency module according to claim 8, wherein the bare chip active element is a bare chip IC.

12. A high-frequency module according to claim 8, further comprising a capacitor connected to the bare chip active element.

13. A high-frequency module according to claim 8, further comprising a plurality of electronic components mounted on the multilayer substrate.

14. A high-frequency module according to claim 8, further comprising a plurality of bumps arranged to fix the bare chip active element on the multilayer substrate.

15. A high-frequency module comprising:
   a multilayer substrate;
   a bare-chip active element mounted on the multilayer substrate;
   a resin arranged to seal the active element on the multilayer substrate; and
   a grounding capacitance connected to the active element, wherein the grounding capacitance includes a strip line provided inside the multilayer substrate and a microstrip line provided on the multilayer substrate.

16. A high-frequency module according to claim 15, wherein the active element includes at least one of a transistor and a field-effect transistor provided in an oscillator stage and a voltage-controlled oscillator is defined by the active element, and wherein the collector of the transistor or the drain of the field-effect transistor is connected to the grounding capacitance to define the voltage-controlled oscillator.

17. A high-frequency module according to claim 15, wherein the high-frequency module includes a voltage controlled oscillator.

18. A high-frequency module according to claim 15, wherein the bare chip active element is a bare chip IC.

19. A high-frequency module according to claim 15, further comprising a capacitor connected to the bare chip active element.

20. A high-frequency module according to claim 15, further comprising a plurality of electronic components mounted on the multilayer substrate.

21. A high-frequency module according to claim 15, further comprising a plurality of bumps arranged to fix the bare chip active element on the multilayer substrate.

* * * * *